(12) United States Patent
Goldblatt et al.

(10) Patent No.: US 9,985,591 B2
(45) Date of Patent: May 29, 2018

(54) DIFFERENTIAL SOURCE FOLLOWER DRIVEN POWER AMPLIFIER

(71) Applicant: QUALCOMM Incorporated, San Diego, CA (US)

(72) Inventors: Jeremy Goldblatt, Encinitas, CA (US); Darryl Jessie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/421,282

(22) Filed: Jan. 31, 2017

(65) Prior Publication Data

US 2018/0123532 A1 May 3, 2018

Related U.S. Application Data

(60) Provisional application No. 62/413,914, filed on Oct. 27, 2016.

(51) Int. Cl.
*H03F 1/56* (2006.01)
*H03F 3/193* (2006.01)
*H03F 3/21* (2006.01)

(52) U.S. Cl.
CPC ........... *H03F 1/56* (2013.01); *H03F 3/193* (2013.01); *H03F 3/21* (2013.01); *H03F 2200/222* (2013.01); *H03F 2200/318* (2013.01); *H03F 2200/387* (2013.01); *H03F 2200/451* (2013.01); *H03F 2200/534* (2013.01); *H03F 2200/69* (2013.01)

(58) Field of Classification Search
USPC .................. 330/302, 98, 133, 150, 310–311
See application file for complete search history.

(56) References Cited

U.S. PATENT DOCUMENTS

| | | | |
|---|---|---|---|
| 5,844,443 A * | 12/1998 | Wong | H03F 1/302 330/275 |
| 7,199,658 B2 | 4/2007 | Floyd et al. | |
| 7,697,915 B2 | 4/2010 | Behzad et al. | |
| 7,705,674 B2 | 4/2010 | McMorrow | |
| 8,836,374 B2 * | 9/2014 | Hadji-Abdolhamid | H03K 19/00 327/54 |
| 9,391,572 B2 | 7/2016 | Staudinger | |
| 2015/0155831 A1 | 6/2015 | Shirvani | |

* cited by examiner

*Primary Examiner* — Hieu Nguyen
(74) *Attorney, Agent, or Firm* — Qualcomm Incorporated/Seyfarth Shaw LLP

(57) ABSTRACT

A power amplification device includes a power amplifier core stage and a power amplifier driver stage. The power amplifier driver stage receives a radio frequency signal to be amplified by the power amplification device. The power amplifier driver stage includes a first source follower input transistor and a first current source transistor. A source of the first source follower input transistor is coupled to a drain of the first current source transistor. The source of the first source follower input transistor is directly coupled to the power amplifier core stage to drive the power amplifier core stage. An input match and passive voltage gain device is coupled to the power amplifier driver stage to generate a voltage gain at an input of the power amplifier driver stage. A first bias source is configured to generate a first bias signal to bias the power amplifier driver stage.

23 Claims, 11 Drawing Sheets

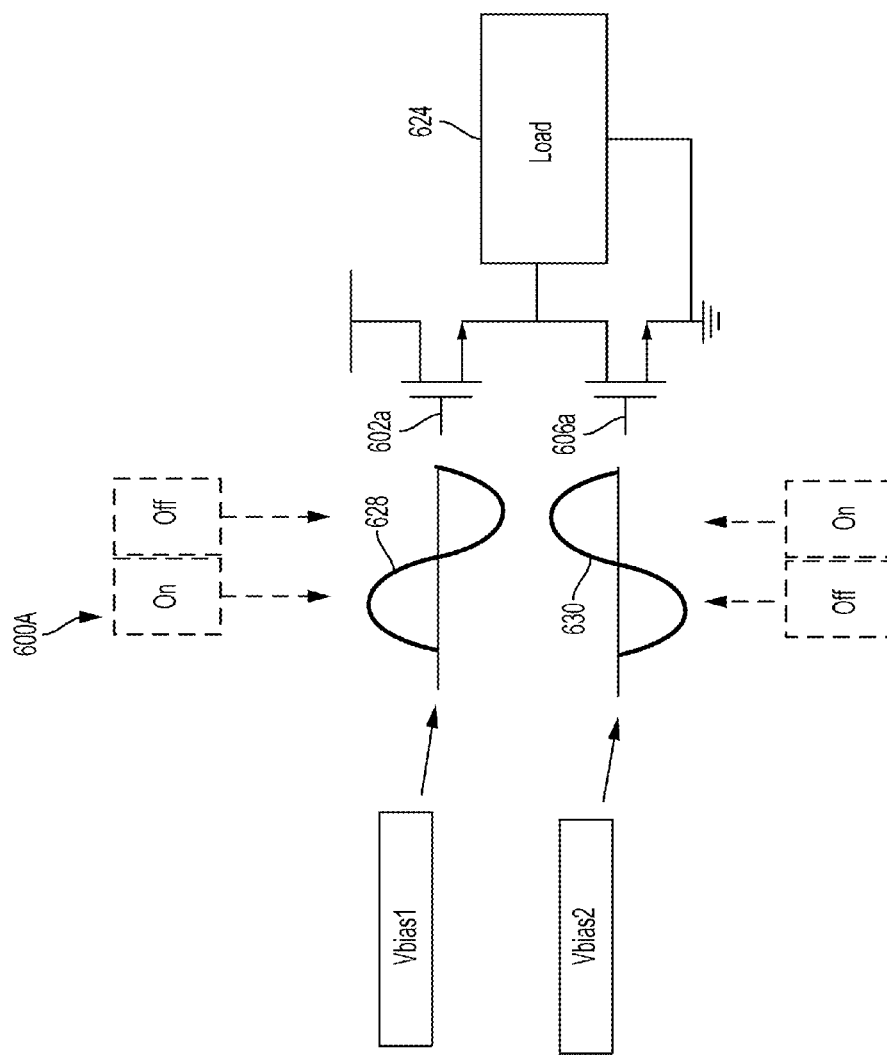

DIFFERENTIAL SOURCE FOLLOWER DRIVEN POWER AMPLIFIER

CROSS-REFERENCE TO RELATED APPLICATION

The present application claims the benefit of U.S. Provisional Patent Application No. 62/413,914, filed on Oct. 27, 2016, and titled "DIFFERENTIAL SOURCE FOLLOWER DRIVEN POWER AMPLIFIER," the disclosure of which is expressly incorporated by reference herein in its entirety.

TECHNICAL FIELD

The present disclosure generally relates to differential source follower driven power amplifiers. More specifically, the present disclosure relates to passive networks or transformers for use with a differential push-pull source follower driven power amplifier.

BACKGROUND

A wireless device may include one or more antennas at a transmitter and one or more antennas at a receiver. The transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce radio frequency (RF) signals. The power amplifier amplifies the RF signals prior to transmission via transmit antennas.

Electronic signals representing user data are transmitted from the transmit antennas through amplifiers used for increasing a power and/or an amplitude of the electronic signals. Most electronic amplifiers operate by using power from a power supply, and controlling an output signal to match the shape of an input signal, while providing a higher amplitude signal.

One widely used type of electronic amplifier is a power amplifier. A power amplifier is a versatile device used in various applications to meet design requirements for signal conditioning, special transfer functions, analog instrumentation, analog computation, and the like. Power amplifiers are often used in wireless applications, and may employ RF amplifier designs for use in the RF range of the electromagnetic spectrum. An RF power amplifier is a type of electronic amplifier used to convert a low power RF signal into a signal of significant power, typically for driving an antenna of a transmitter. RF power amplifiers may be used to increase the range of a wireless communication system by increasing the output power of a transmitter.

SUMMARY

In an aspect of the present disclosure, a power amplification device includes a power amplifier core stage and a power amplifier driver stage. The power amplifier driver stage receives a radio frequency signal to be amplified by the power amplification device. The power amplifier driver stage includes a set of transistors, such as a first source follower input transistor and a first current source transistor. A source of the first source follower input transistor is coupled to a drain of the first current source transistor. The source of the first source follower input transistor is directly coupled to the power amplifier core stage to drive the power amplifier core stage. An input match and passive voltage gain device is coupled to the power amplifier driver stage to generate a voltage gain at an input of the power amplifier driver stage. A first bias source is configured to generate a first bias signal to bias the power amplifier driver stage.

In another aspect of the present disclosure, a power amplification device includes a power amplifier core stage. The power amplification device also includes a power amplifier driver stage. The power amplifier driver stage receives a radio frequency signal to be amplified by the power amplification device. The power amplifier driver stage includes a set of transistors, such as a first source follower input transistor and a first current source transistor. A source of the first source follower input transistor is coupled to a drain of the first current source transistor. The source of the first source follower input transistor is directly coupled to the power amplifier core stage. The power amplification device further includes means for transforming a voltage associated with the radio frequency signal. The transforming means is coupled to the power amplifier driver stage to generate a voltage gain at an input of the power amplifier driver stage. Furthermore, the power amplification device includes means for generating a first bias signal to bias the power amplifier driver stage.

In yet another aspect of the present disclosure, a method of performing signal amplification by a power amplification device includes generating alternating current based radio frequency signals to drive differential source follower transistors and associated current source transistors. The alternating current based radio frequency signals are on differential radio frequency signals to be amplified by the power amplification device. The method also includes matching an impedance of the differential source follower transistors to a characteristic impedance of a passive network driving the differential source follower transistors and the associated current source transistors. The method further includes generating a passive voltage gain at inputs of the differential source follower transistors. Furthermore, the method includes generating drive signals at outputs of the differential source follower transistors to drive a power amplifier core stage of the power amplification device. The drive signals are based on the passive voltage gain and the alternating current based radio frequency signals.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 6A illustrates a power amplification device including a power amplifier driver stage in a push-pull source follower configuration according to one aspect of the present disclosure.

DETAILED DESCRIPTION

Figure 1:
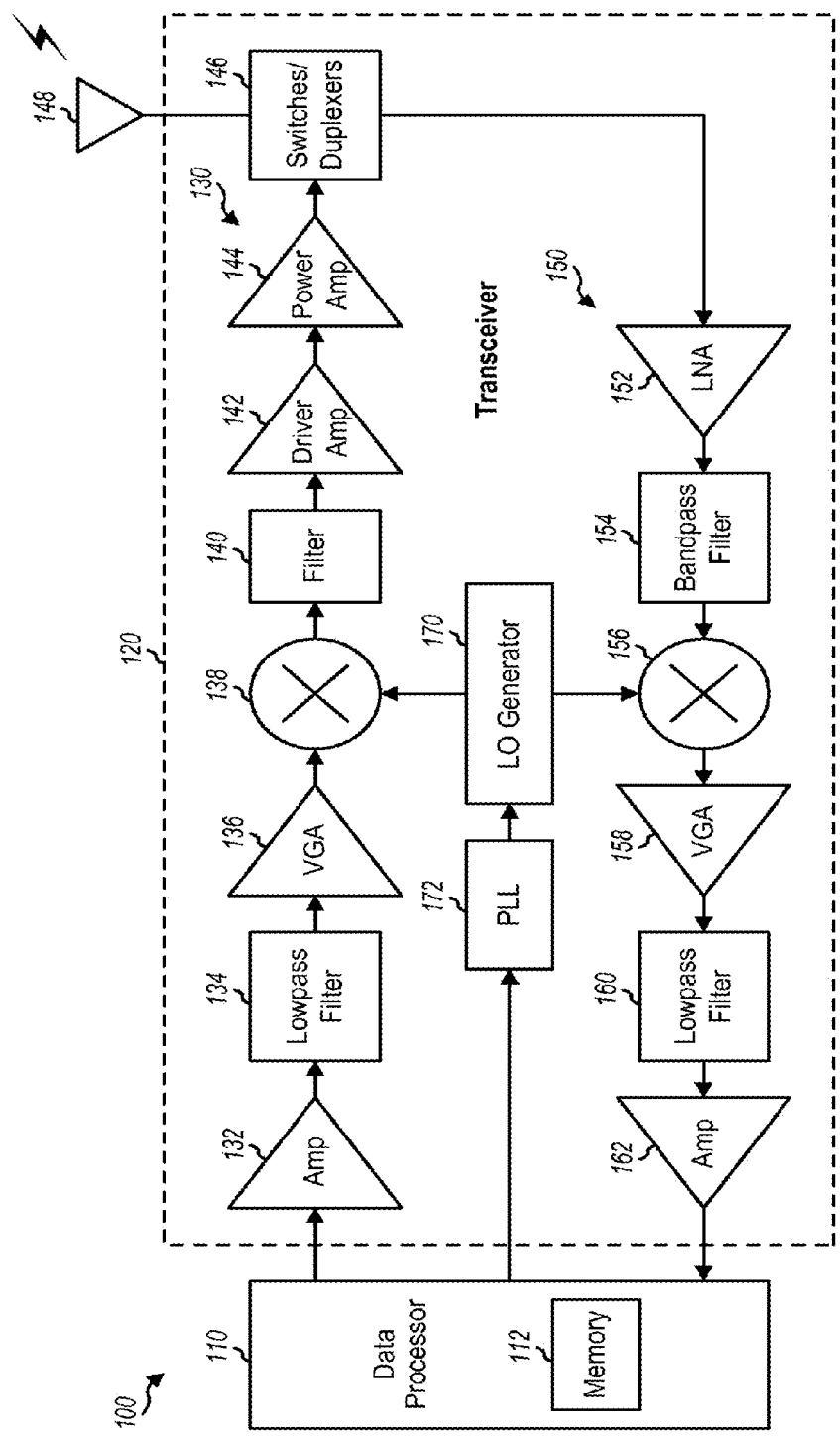
FIG. 1 shows a block diagram of a wireless communication device.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A radio frequency power amplifier is a type of electronic amplifier used to convert a low power radio frequency signal into a signal of significant power, typically for driving an antenna of a transmitter. Radio frequency power amplifiers may be used to increase the range of a wireless communication system by increasing the output power of a transmitted signal. A wireless device, such as a user equipment (UE), may include transmit chains that are composed of multiple radio frequency transmitters, multiple power amplifiers, multiple antennas and one or more front end (FE) devices through which signals are transmitted from the UE.

Various exemplary designs of an amplifier module (e.g., a power amplifier module or power amplification device) with multiple operating modes and having improved performance are described herein. For example, aspects of the present disclosure are directed to a power amplification device that includes a power amplifier driver stage coupled to a power amplifier core stage. The power amplifier driver stage includes a passive network (e.g., a transformer and associated capacitors and inductors) coupled to one or more gain-less buffers or broad band buffers (e.g., source follower input transistors) to generate a gain that would otherwise be generated by a driver amplifier stage that consumes more physical space. The transformer includes independently tunable primary and secondary winding stages (e.g., winding tank circuits). The transformer may be designed to have a low coupling factor between the primary and secondary winding stages. The capability to independently tune the primary and secondary winding stages in combination with the low coupling factor achieves, among others, an increased communication band (broadest band), and improved input impedance matching with simultaneous voltage gain while remaining stable.

The power amplification device may be used in various electronic devices such as wireless communication devices, cellular phones, personal digital assistants (PDAs), handheld devices, wireless modems, laptop computers, cordless phones, Bluetooth devices, consumer electronic devices, etc. For clarity, the use of the power amplification device in a wireless communication device is described below.

FIG. 1 shows a block diagram of an exemplary design of a wireless communication device 100. In this exemplary design, the wireless device 100 includes a data processor 110 and a transceiver 120. The transceiver 120 includes a transmitter 130 and a receiver 150 that support bi-directional wireless communication. In general, the wireless device 100 may include any number of transmitters and any number of receivers for any number of communication systems and any number of frequency bands.

In the transmit path, the data processor 110 processes data to be transmitted and provides an analog output signal to the transmitter 130. Within the transmitter 130, the analog output signal is amplified by an amplifier (Amp) 132, filtered by a low pass filter 134 to remove images caused by digital-to-analog conversion, amplified by a variable gain amplifier (VGA) 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, the antenna 148 receives signals from base stations and/or other transmitter stations and provides a received signal, which is routed through the switches/duplexers 146 and provided to the receiver 150. Within the receiver 150, the received signal is amplified by a low noise amplifier (LNA) 152, filtered by a bandpass filter 154, and downconverted from radio frequency to baseband by a mixer 156. The downconverted signal is amplified by a VGA 158, filtered by a low pass filter 160, and amplified by an amplifier 162 to obtain an analog input signal, which is provided to the data processor 110.

FIG. 1 shows the transmitter 130 and the receiver 150 implementing a direct-conversion architecture, which frequency converts a signal between radio frequency and baseband in one stage. The transmitter 130 and/or the receiver 150 may also implement a super-heterodyne architecture, which frequency converts a signal between radio frequency and baseband in multiple stages. A local oscillator (LO) generator 170 generates and provides transmit and receive LO signals to the mixers 138 and 156, respectively.

A phase locked loop (PLL) 172 receives control information from the data processor 110 and provides control signals to the LO generator 170 to generate the transmit and receive LO signals at the proper frequencies.

FIG. 1 shows an exemplary transceiver design. In general, the conditioning of the signals in the transmitter 130 and the receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and the receiver. For example, matching circuits may be used to match various active circuits in FIG. 1. Some circuits in FIG. 1 may also be omitted. The transceiver 120 may be implemented on one or more analog integrated circuits (ICs), radio frequency ICs (RFICs), mixed-signal ICs, etc. For example, the amplifier 132 through the power amplifier 144 in the transmitter 130 may be implemented on an RFIC. The driver amplifier 142 and the power amplifier 144 may also be implemented on another IC external to the RFIC.

The data processor 110 may perform various functions for the wireless device 100, e.g., processing for transmitted and received data. A memory 112 may store program codes and data for the data processor 110. The data processor 110 may be implemented on one or more application specific integrated circuits (ASICs) and/or other ICs.

As shown in FIG. 1, a transmitter and a receiver may include various amplifiers. Each amplifier at radio frequency may have input impedance matching and output impedance matching, which are not shown in FIG. 1 for simplicity.

Figure 2:
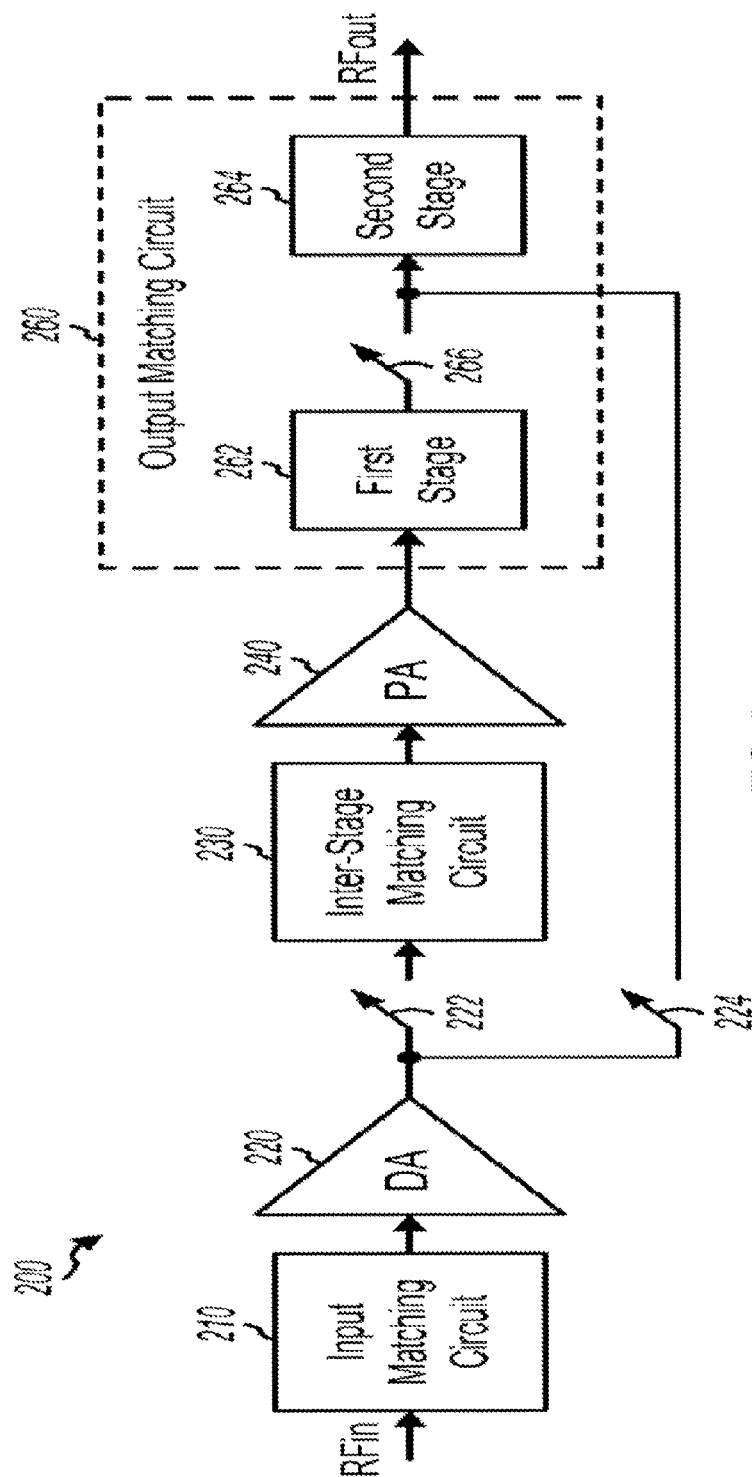
FIG. 2 shows a block diagram of a conventional power amplifier (PA) module or power amplification device.

FIG. 2 shows a block diagram of a conventional power amplifier (PA) module or power amplification device 200. A conventional two-stage power amplifier of the power amplification device 200 includes a driver amplifier (DA) 220 and power amplifier core or power amplifier 240. The driver amplifier may be an open drain driver amplifier. The power amplification device 200 may be used for the driver amplifier 142 and the power amplifier 144 in FIG. 1. Within the power amplification device 200, an input matching circuit 210 receives an input radio frequency signal (RFin) and has its output coupled to the input of the driver amplifier (DA) 220. The DA 220 is coupled to an inter-stage matching circuit 230. A power amplifier 240 has its input coupled to the output of the inter-stage matching circuit 230 and its output coupled to the input of an output matching circuit 260. The output matching circuit 260 includes a first stage 262, and a second stage 264 coupled in series. The first stage 262 is coupled to the input of the second stage 264. The output matching circuit 260 provides an output RF signal (RFout).

From input to output of the power amplifier, the power handling of the underlying circuitry increases. With the maximum power per unit area being a physical constraint area, the increase is proportional with power increases. Even though the driver amplifier has fewer power handling requirements then the power amplifier core itself, it is by no means negligible. Thus, to make a competitive reliable power amplifier, the driver amplifier stage and the silicon area it occupies for reliable operation is not negligible.

Aside from power density, there are additional constraints such as device reliable voltage limits. Voltage limit reliability and the resolution of the reliability concerns usually result in a larger occupied silicon area. Techniques in device physics to combat voltage potential reliability involve lowering electric field strength by physically spacing the terminals. This results in a performance degradation, which is usually mitigated by increasing the number of the devices. In other words, high voltage transistors have features that are larger in dimension for proportional robustness. As a result, high voltage transistors consume larger area to obtain equivalent performance (trans-conductance) as their low voltage transistor counterparts. High voltage transistors are around two to four times the size of low voltage transistors of equivalent trans-conductance.

Power amplifiers have a driver amplifier stage, which shares the same supply voltage as the power amplifier core, and because efficiency of the driver amplifier is desired for a competitive product, the output of the driver amplifier has proportionally large voltage excursion proportional to an input power that is similar to the input power of the power amplifier core. A reliable driver amplifier designed this way uses high voltage transistors to interface the voltage deviations. Additionally, these voltage deviations are too large to interface the power amplifier core. Thus, the voltage deviations are proportionally scaled to usable levels while reducing loss. For example, an impedance transform network is used to transform the high impedance at a drain of the driver amplifier to a low impedance at a gate of the power amplifier. This network is designed to transform the voltage to usable levels while reducing the overall power loss. Low power loss generally equates to wider less resistive metal structures and in general larger overall physical size.

Figure 3:
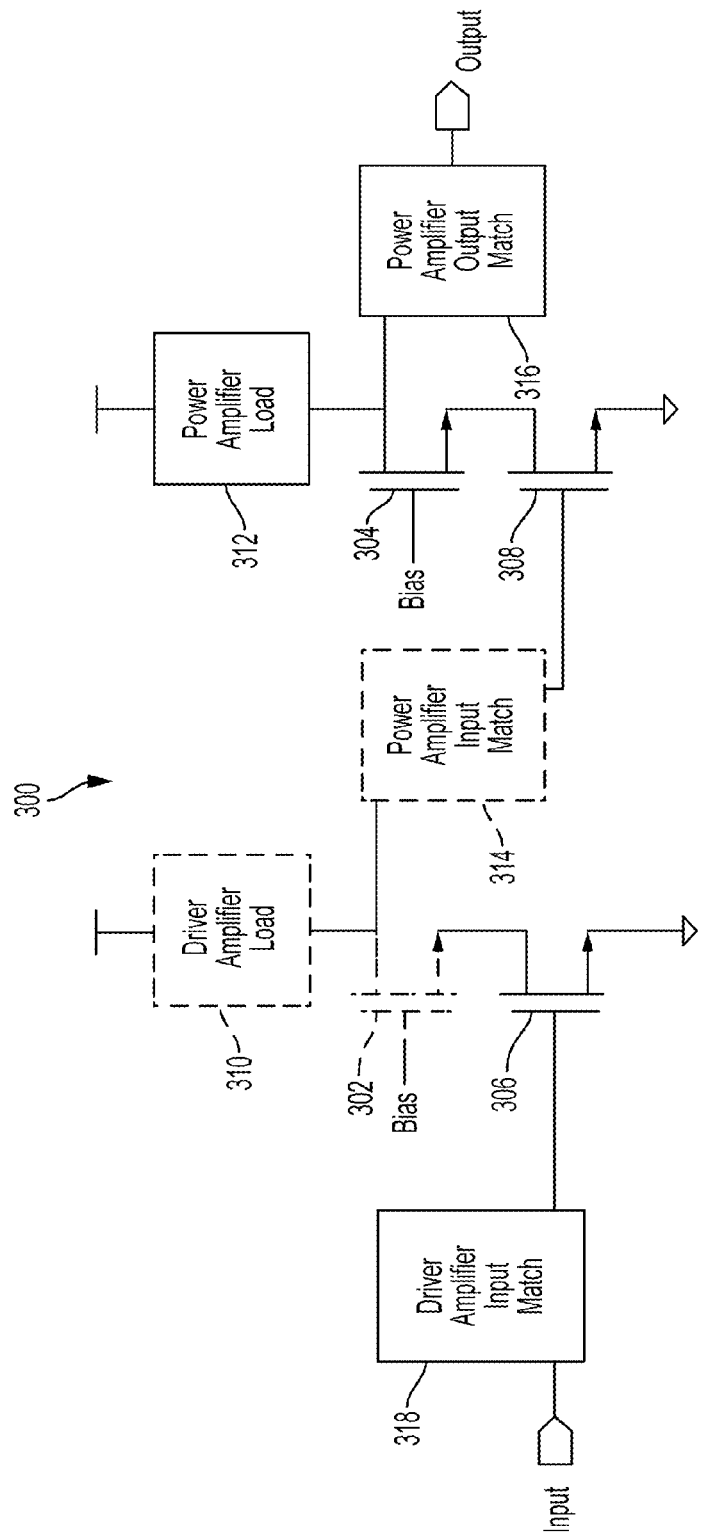
FIG. 3 illustrates a power amplification device including a power amplifier core stage and a driver amplifier stage according to one aspect of the present disclosure.

FIG. 3 illustrates a power amplification device 300 including a power amplifier core stage and a driver amplifier stage, according to one aspect of the present disclosure. The power amplifier core stage includes transistors 304 and 308 while the driver amplifier stage includes transistors 302 and 306. The driver amplifier stage also includes a driver amplifier input matching circuit 318 and a driver amplifier load 310. The power amplifier core stage also includes the power amplifier load 312 and a power amplifier output matching circuit 316. The driver amplifier load 310 and the power amplifier load 312 are respectively coupled to transistors 302 and 304. A power amplifier input matching circuit 314 and the power amplifier output matching circuit 316 may be respectively similar to the inter-stage matching circuit 230 and the output matching circuit 260 of FIG. 2.

The driver amplifier input matching circuit 318 may receive an input signal and provide an output signal to a gate of the transistor 306. The power amplifier input matching circuit 314 may be positioned between the power amplifier core stage and the driver amplifier stage. The power amplifier input matching circuit 314 may be part of the driver amplifier stage and may be coupled to the transistor 302 and the transistor 308. For example, the power amplifier input matching circuit 314 is coupled to a drain of the transistor 302 and to a gate of the transistor 308. Similarly, the driver amplifier load 310 is coupled to the drain of the transistor 302. The power amplifier output matching circuit 316 is coupled to the drain of the transistor 304. Similarly, the power amplifier load 312 is coupled to the drain of the transistor 304. The transistors 302 and 304 may be biased by different bias signals at their respective gates.

The driver amplifier stage including the driver amplifier load 310, the transistor 302 and the power amplifier input matching circuit 314 may include high voltage transistors, inductor coils and capacitors, and high voltage capable switch configurations for capacitor tuning. A combination of the driver amplifier load 310, the transistor 302 and the power amplifier input matching circuit 314 account for a significant portion (e.g., up to 25%) of the total physical size of the power amplification device 300. Some power amplification devices are configured to reduce a physical size as illustrated in FIG. 4.

Figure 4:
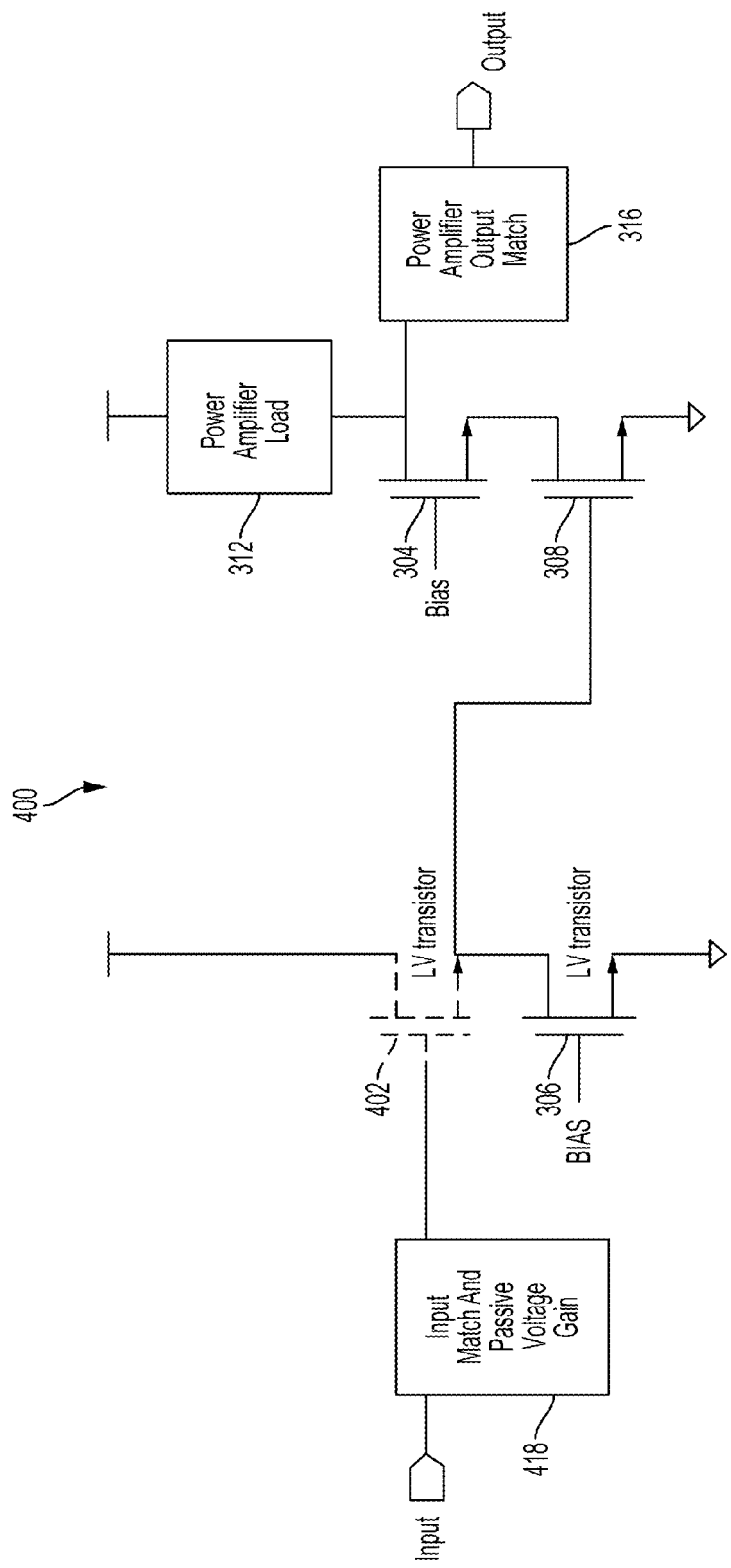
FIG. 4 illustrates a power amplification device including a power amplifier core stage and a power amplifier driver stage according to another aspect of the present disclosure.

FIG. 4 illustrates a power amplification device 400 including a power amplifier core stage and a power amplifier driver stage, according to one aspect of the present disclosure. The difference between the illustration of FIGS. 3 and 4 is that in FIG. 4, the driver amplifier load 310 and the power amplifier input matching circuit 314 that are part of the driver amplifier stage are removed. In some implementations, the high voltage transistor 302 of FIG. 3 is replaced with a low voltage transistor 402. In addition, the driver amplifier input matching circuit 318 of FIG. 3 is replaced with an input match and passive voltage gain circuit 418 (e.g., a passive network) to make up the gain that was provided by the driver amplifier stage. The input match and passive voltage gain circuit 418, however, is coupled to the gate of the transistor 402. Further, the transistor 306 and the transistor 304 are biased by different bias signals at their respective gates. Furthermore, an output or source of the transistor 402 is coupled to the gate of the transistor 308.

Thus, alternative to the approach illustrated in FIG. 3, the illustration in FIG. 4 substitutes a gain-less buffer for the driver amplifier stage. An example of a simple gain-less buffer or broad band buffer is a first source follower input transistor 402. The first source follower input transistor 402 may be a low voltage transistor. This first source follower input transistor 402 provides enough power to drive the power amplifier core stage. Replacing the gain that the driver amplifier provides with an equivalent voltage gain before the buffer or the first source follower input transistor 402 circumvents the need for high voltage capable circuitry of the driver amplifier output specified for conventional designs. Additionally the voltage gain can be purely passive due to the relatively high impedance at the input to the first source follower input transistor 402 when compared to an impedance of an external source through which a radio frequency signal is provided to the power amplifier driver stage. The voltage gain is proportional to an impedance transformation ratio. The transistor 306 may represent a current source and is accordingly described as a first current source transistor 306.

Figure 5:
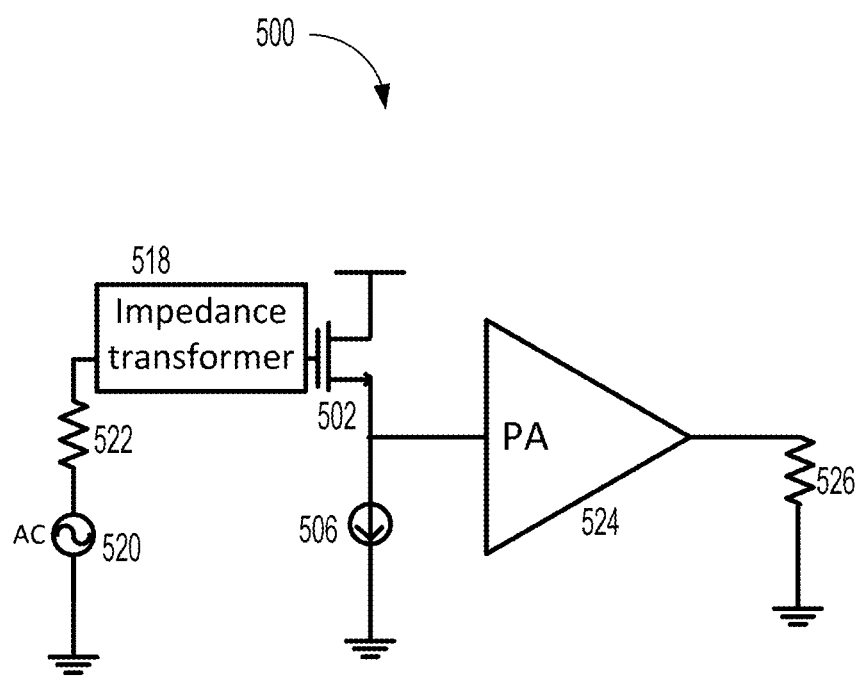
FIG. 5 illustrates another power amplification device including a power amplifier core stage and a power amplifier driver stage according to an aspect of the present disclosure.

FIG. 5 illustrates another power amplification device 500 including a power amplifier core stage and a power amplifier driver stage, according to one aspect of the present disclosure. A difference between the illustration of FIGS. 3 and 5 is that in FIG. 5, the driver amplifier load 310 and the power amplifier input matching circuit 314 that are part of the driver amplifier stage are removed. In one aspect of the disclosure, the driver amplifier stage is replaced with the power amplifier driver stage, which includes the gain-less buffer (e.g., a source follower input transistor 502), an input match and passive voltage gain device 518 (e.g., an impedance transformer and associated inductors and capacitors) and a current source 506. The power amplifier driver stage may receive a radio frequency signal from the external source. The external source may be represented by an alternating current (AC) source 520 coupled to a resistor 522. The power amplifier core stage may include a power amplifier 524 coupled to a resistor 526.

Thus, instead of a conventional open drain driver amplifier, the source follower input transistor 502 enables designers to achieve a smaller overall power amplifier. The smaller power amplifier may be achieved by removing the inter-stage match (e.g., the inter-stage matching circuit 230 or power amplifier input matching circuit 314), the driver amplifier load (e.g., driver amplifier load 310), large high voltage driver amplifier output device(s) and high voltage capable switchable capacitances.

The source follower input transistor 502 has a relatively high input impedance while presenting a low impedance to the low impedance power amplifier core stage. The higher input impedance of the source follower input transistor 502 enables passive gain through the input match and passive voltage gain device 518. The input match and passive voltage gain device 518 may be a step up transformer or other inductor-capacitor (LC) transform network.

In some aspects, the source follower input transistor 502 may be a low voltage transistor that meets reliability specifications. Accordingly, the output of the low voltage transistor that is provided as an input (e.g., input voltage) to the power amplifier core stage meets a desirable voltage range according to reliability specifications. For example, the supply voltage of the source follower input transistor 502 can be 1.8 V that is already available in most systems.

The source follower input transistor 502 isolates the low impedance of the power amplifier input. The isolation of the input of the source follower input transistor 502 from the output is desirable for the power amplifier core stage with signals that may be subject to input impedance changes. This isolation improves amplitude modulation/phase modulation conversion, which results in improved linear operation under varying signal power levels. For additional power savings the source follower input transistor 502 can be configured in a push-pull source follower configuration, as illustrated in FIG. 6A.

FIG. 6A illustrates a power amplification device 600A including a power amplifier driver stage in a push-pull source follower configuration, according to one aspect of the present disclosure. The push-pull amplifier configurations can be fabricated to use an input transformer to generate 0° and 180° phase inputs for a pair of transistors and an output transformer for combining the outputs of the pair of transistors in phase. For example, the power amplifier driver stage of the power amplification device 600A may include a first source follower input transistor 602a and a first current source transistor 606a. A source of the first source follower input transistor 602a may be coupled to a drain of the first current source transistor 606a.

The first source follower input transistor 602a and the current source transistor 606a may be respectively biased by a first bias signal (Vbias1) and a second bias signal (Vbias2). The first bias signal Vbias1 and the second bias signal Vbias2 may be direct current (DC) bias voltages that are different. The term direct current may indicate operation at low frequencies such as 0 hertz. The first bias signal Vbias1 and the second bias signal Vbias2 may also include a time varying voltage (F(t)) or a radio frequency signal.

The push-pull source follower configuration has complimentary transistor radio frequency signals 628 and 630, respectively, at the input of the first source follower input transistor 602a and the input of the first current source transistor 606a. The complimentary transistor radio frequency signals may be alternating current (AC) signals. For example, the complimentary transistor radio frequency signals are characterized by alternating current associated with higher frequencies. The complimentary signals may have substantially equal amplitudes but may be out of phase by approximately 180 degrees.

The output of each of the transistors 602a and 606a may be coupled to a load 624 (e.g., the power amplifier core stage) such that drive signals from the transistors 602a and 606a are provided at their respective outputs to drive the load 624. For example, a source of the first source follower input transistor 602a is coupled to the load 624 while a drain of the first current source transistor 606a is coupled to the load 624. The drive signals may be based on the complimentary transistor radio frequency signals 628 and 630 respectively received by the first source follower input transistor 602a and the first current source transistor 606a. The complimentary transistor radio frequency signals may be based on radio frequency signals received from the external source. The transistor radio frequency signals 628 and 630 are complimentary such that when the signal 628 is increasing (towards ON), the signal 630 is decreasing (towards OFF) and vice versa. Alternating the radio frequency (RF) signal polarity (towards ON/OFF) of the transistor radio frequency signals 628 and 630 to the gates of the first source follower input transistor 602a and the first current source transistor 606a determines the transistor 602a or 606a that provides drive signals to the load 624.

The first source follower input transistor 602a provides the load 624 with a buffered voltage when the first source follower input transistor 602a is increasing or toward ON. The first current source transistor 606a provides the load 624 with alternating current when the first source follower input transistor 602a cannot drive the load 624. For example, when the first source follower input transistor 602a is driving the load 624, the first current source transistor 606a is powered down and when the first current source transistor 606a is driving the load 624, the first source follower input transistor 602a is powered down. Thus, the first current source transistor 606a supplements the driving of the load 624 by the first source follower input transistor 602a. A fully differential implementation of the source follower buffer stage or push-pull source follower configuration enables additional power saving benefits. An example of such a differential implementation is illustrated in FIG. 6B.

Figure 6B:
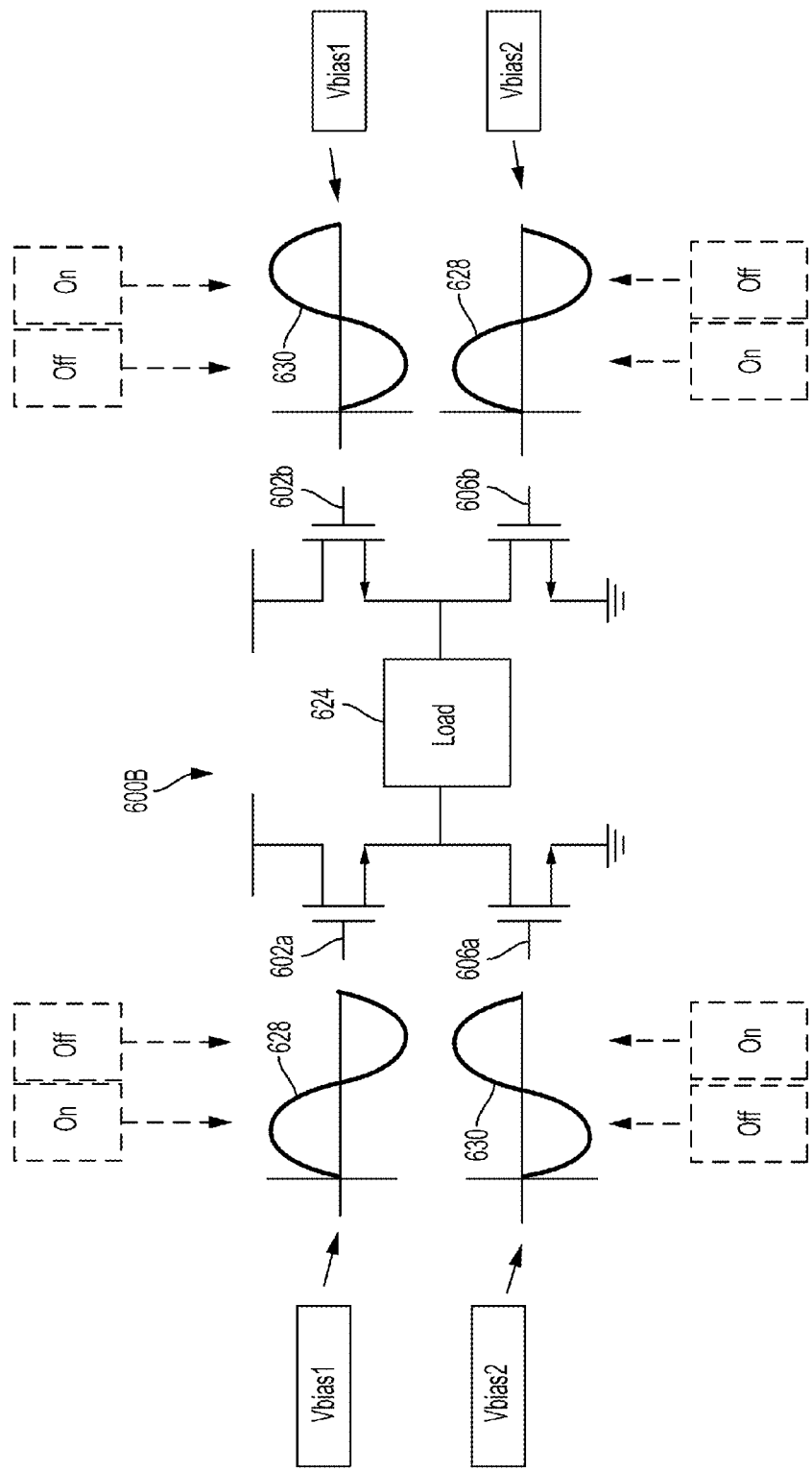
FIG. 6B illustrates another power amplification device including a power amplifier driver stage in a differential push-pull source follower configuration according to one aspect of the present disclosure.

FIG. 6B illustrates another power amplification device 600B including a power amplifier driver stage in a differential push-pull source follower configuration, according to one aspect of the present disclosure. For illustrative purposes, some of the labelling and numbering of the components and features of FIG. 6B are similar to those of FIG. 6A.

In addition to the devices in FIG. 6A, the power amplifier driver stage of the power amplification device 600B of FIG. 6B includes a second source follower input transistor 602b and a second current source transistor 606b. The pairing of the second source follower input transistor 602b and the second current source transistor 606b and the pairing of the first source follower input transistor 602a and the first current source transistor 606a are arranged in accordance with a differential configuration (e.g., differential push-pull source follower configuration). Differential signals generated in accordance with the differential configuration are used to drive the load 624. The differential signals may be buffered voltage signals generated by the first and/or the second source follower input transistors 602a and 602b or alternating current generated by the first current source transistors 606a and/or the second current source transistor 606b. A source of the second source follower input transistor 602b may be coupled to a drain of the second current source transistor 606b. The second source follower input transistor 602b and the second current source transistor 606b may be respectively biased by the first bias signal (Vbias1) and the second bias signal (Vbias2).

The differential push-pull source follower configuration specifies transistor radio frequency signals at the input of the first and second source follower input transistor 602a and 602b. These transistor radio frequency signals are associated with different RF signal polarity at terminals of primary winding stages of a transformer to achieve complimentary characteristics of the transistor radio frequency signals. For example, the first and second source follower input transistors 602a and 602b are biased by the first bias signal (Vbias1) and receive transistor radio frequency signals 628 and 630 at their respective inputs (e.g., gates). Similarly, the differential push-pull source follower configuration specifies that the first and second current source transistors 606a and 606b receive transistor radio frequency signals based on different polarities of terminals of the transformer to achieve complimentary characteristics. The first and second current source transistors 606a and 606b are biased by the second bias signal (Vbias2) and receive transistor radio frequency signals 630 and 628 at their respective inputs (e.g., gates).

Figure 7:
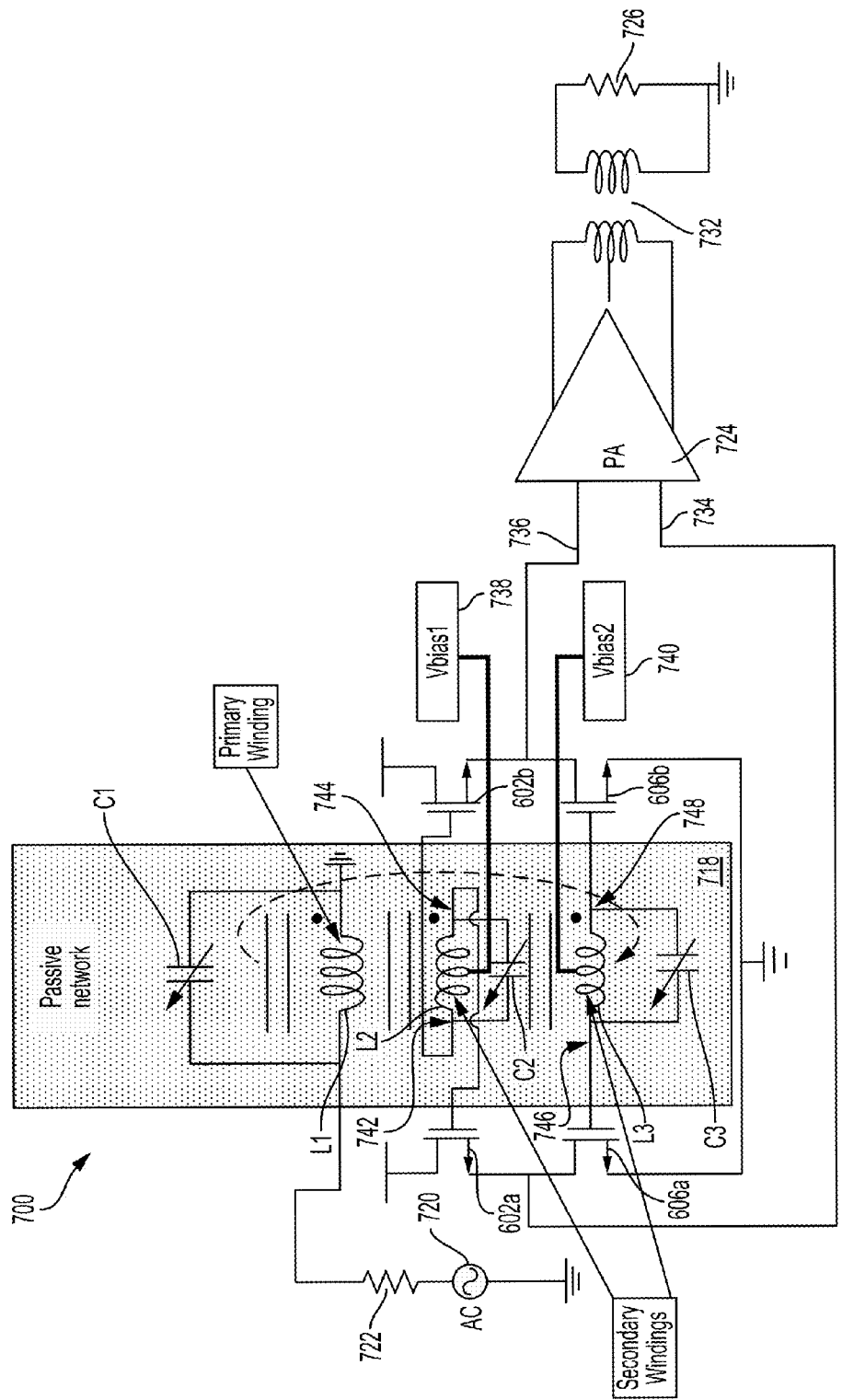
FIG. 7 illustrates another power amplification device including a power amplifier driver stage in a differential push-pull source follower configuration according to one aspect of the present disclosure.

FIG. 7 illustrates another power amplification device 700 including a power amplifier driver stage in a differential push-pull source follower configuration according to one aspect of the present disclosure. For illustrative purposes, some of the labelling and numbering of the components and features of FIG. 7 are similar to those of FIGS. 6A and 6B. The power amplification device 700 includes a power amplifier core stage and a power amplifier driver stage. The power amplifier core stage includes a power amplifier 724 coupled to an output transformer 732 and resistor 726 for combining outputs of the transistors of the power amplifier driver stage in phase. The power amplifier driver stage includes a first set of transistors and a second set of transistors. The first set of transistors includes the pairing of the first source follower input transistor 602a and the first current source transistor 606a. The second set of transistors includes the pairing of the second source follower input transistor 602b and the second current source transistor 606b.

The power amplifier driver stage also includes or is coupled to a passive network 718. The passive network 718 is coupled to the first source follower input transistor 602a, the first current source transistor 606a, the second source follower input transistor 602b and the second current source transistor 606b. For example, the passive network 718 is coupled between the pairing of the second source follower input transistor 602b and the second current source transistor 606b and the pairing of the first source follower input transistor 602a and the first current source transistor 606a.

In one aspect of the disclosure, a source of the first source follower input transistor 602a is coupled to a drain of the first current source transistor 606a. The source of the first source follower input transistor 602a is also directly coupled to a first input 734 of the power amplifier 724 to provide a first part of complementary drive signals based on the first bias signal (Vbias1) for driving the power amplifier 724. Similarly, a source of the second source follower input transistor 602b is coupled to a drain of the second current source transistor 606b. The source of the second source follower input transistor 602b is also directly coupled to a second input 736 of the power amplifier 724 to provide a second part of the complementary drive signals based on the first bias signal (Vbias1) for driving the power amplifier 724.

Complementary signals based on the second bias signal (Vbias2) may also be provided to the power amplifier 724 by the first and the second current source transistors 606a and 606b to supplement the driving of the power amplifier 724 by the first and second source follower input transistors 602a and 602b. A drain of the first current source transistor 606a is directly coupled to the first input 734 of the power amplifier 724 to provide a first part of complementary drive signals based on the second bias signal (Vbias2) for driving the power amplifier 724. Similarly, a drain of the second current source transistor 606b is directly coupled to the second input 736 of the power amplifier 724 to provide a second part of the complementary drive signals based on the second bias signal (Vbias2) for driving the power amplifier 724.

The buffered voltage and alternating current signals from the transistors 602a, 602b, 606a and 606b are based on transistor radio frequency signals provided to the input of the transistors 602a, 602b, 606a and 606b by the passive network 718. The transistor radio frequency signals are provided to the gates of the transistors 602a, 602b, 606a and 606b. The transistor radio frequency signals are based on the first and the second bias voltages Vbias1 and Vbias2 as well as the radio frequency signal to be amplified. The radio frequency signal may be received by the passive network 718 from an external source. The external source may be represented by an alternating current (AC) source 720 coupled to a resistor 722. The power amplifier driver stage including the passive network 718 generates a gain (e.g., voltage gain) at the input of the power amplifier 724 or before amplification by the power amplifier 724. The voltage gain is a passive voltage gain that is based on a high input impedance of the first source follower input transistor 602a or the second source follower input transistor 602b relative to an impedance of the external source through which the radio frequency signal is provided to the power amplifier driver stage.

In one aspect of the disclosure, the passive network includes a transformer. The transformer includes a primary winding stage coupled to the external source and two secondary winding stages (first and second secondary winding stages) coupled to the transistors 602a, 602b, 606a and 606b. A coupling factor (e.g., selected during a design phase) between the primary winding stage and the first secondary winding stage is substantially the same as the coupling factor between the primary winding stage and the second secondary winding stage. The coupling factor between the primary winding stage and each of the secondary winding stages may be a low coupling factor. The coupling factor ranges from "0" to "1", where "1" indicates a perfect coupling. A low coupling factor may be below forty percent (40%). In some aspects of the disclosure, the coupling factor between the first secondary winding stage and the second secondary winding stage is substantially equal to one or approaches unity.

The low coupling factor provides flexibility that is beneficial to providing passive gain at desired frequencies, desired in-band response, and desired out of band rejection, while simultaneously impedance matching to the external source. The low coupling factor in combination with the independently tunable/adjustable capacitors further provides benefits derived from each component of a primary/secondary inductor-capacitor (LC) tank network in addition to the coupling of the tanks through the transformer that links the two LC networks. The combined network including the primary/secondary inductor-capacitor (LC) tank network in addition to the coupling of the tanks through the transformer that links the two LC networks increases a range of complex impedance combinations available at both the primary winding stage and the secondary winding stage, relative to a conventional transformer.

Additionally, this combined network differs from an ordinary transformer because an in-band response frequency and out of band rejection of the combined network achieve performance similar to a low order bandpass filter. This combined network is similar to an ordinary transformer in that it provides voltage gain through impedance transformation. The added degree of freedom provided by this combined network allows for concatenation of several desired attributes into a single adjustable network.

The primary winding stage includes a first pairing of a first capacitor C1 and a primary winding inductor L1. The first secondary winding stage includes a second pairing of a second capacitor C2 and a first secondary winding inductor L2. The second secondary winding stage includes a third pairing of a third capacitor C3 and a second secondary winding inductor L3. The first capacitor C1, the second capacitor C2, and/or the third capacitor C3 are adjustable capacitors. The capacitors are independently adjustable to independently tune the primary winding stage and each secondary winding stage. Adjusting the capacitors transforms or adjusts the impedance of the passive network 718 for the tuning. The capacitors are adjusted to achieve impedance matching and to couple power over a range of frequencies.

For example the capacitors C2 and C3 can be adjusted to resonate the secondary winding stage at a frequency near the channel center frequency and the capacitor C1 can be adjusted to resonate at a similar frequency. Both resonances will be linked through the relatively weak flux of the transformer creating the desired band pass response. Additionally, relatively small additional tuning of the primary and secondary resonances can have beneficial effects on aligning the impedance to that of the external source.

In one aspect of the disclosure, a first bias source 738 is coupled to a center tap of the first secondary winding inductor L2 to provide the first bias voltage Vbias1 to the first secondary winding inductor L2. The first source follower input transistor 602a and the second source follower input transistor 602b are biased based on the bias voltage Vbias1. A second bias source 740 is coupled to a center tap of the second secondary winding inductor L3 to provide the second bias voltage Vbias2 to the second secondary winding inductor L3. The first current source transistor 606a and the second current source transistor 606b are biased based on the bias voltage Vbias2.

In some aspects of the disclosure, the first secondary winding stage includes a first terminal 742 of a first radio frequency (RF) signal polarity or alternating current signal polarity and a second terminal 744 of a different second RF signal polarity. The second secondary winding stage includes a third terminal 746 of the first RF signal polarity and a fourth terminal 748 of the different second RF signal polarity. For example, one RF signal polarity may have a first phase (e.g., 0 degrees) while a different RF signal polarity may be out of phase with the first phase by 180 degrees. The first terminal 742 is coupled to a gate of the second source follower input transistor 602b and the second terminal 744 is coupled to a gate of the first source follower input transistor 602a to generate transistor radio frequency signals or transistor alternating current signals to the second source follower input transistor 602b and the first source follower input transistor 602a. The transistor radio frequency signals to the second source follower input transistor 602b and the first source follower input transistor 602a are based on the first bias voltage Vbias1 or the second bias voltage Vbias2 and the received radio frequency signal. The implementation achieves a relatively high input impedance while presenting a low impedance to the low impedance power amplifier core stage.

Figure 8A:
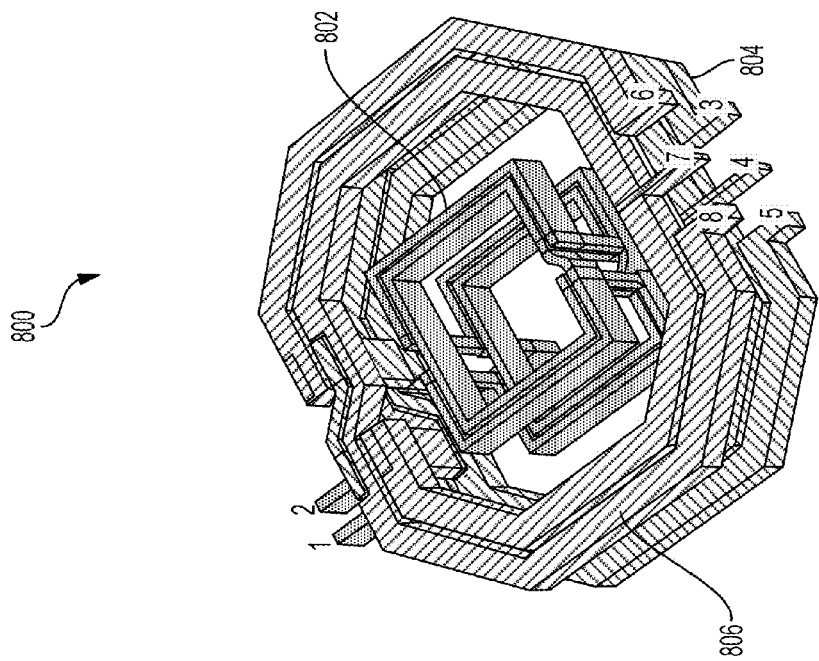
FIG. 8A illustrates an exemplary view of a transformer used in a passive network of the power amplification device according to one aspect of the present disclosure.
Figure 8B:
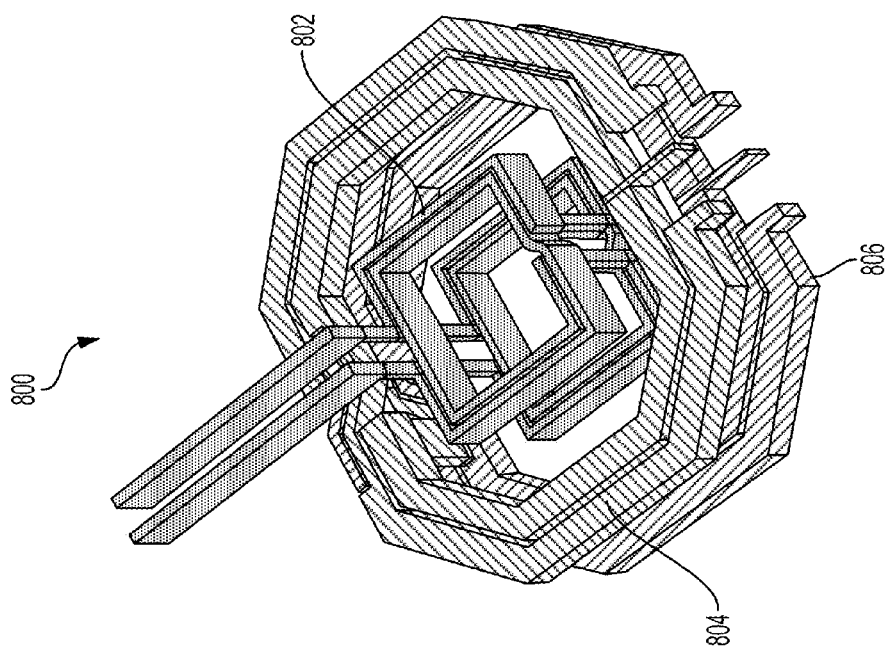
FIG. 8B illustrates another exemplary view of the transformer used in a passive network of the power amplification device according to one aspect of the present disclosure.

FIGS. 8A and 8B illustrate a transformer 800 used in a passive network of the power amplification device, according to one aspect of the present disclosure. FIG. 8A illustrates a first exemplary view (e.g., a top side) of the transformer 800 and FIG. 8B illustrates a different exemplary view (e.g., bottom side) of the transformer 800. The transformer includes a primary winding stage 802 coupled to two secondary winding stages (a first secondary winding stage 804 and a second secondary winding stage 806). The primary winding stage 802 is physically centrally positioned relative to the first secondary winding stage 804 and the second secondary winding stage 806. The first secondary winding stage 804 and the second secondary winding stage 806 are physically symmetrically equivalent.

Figure 9:
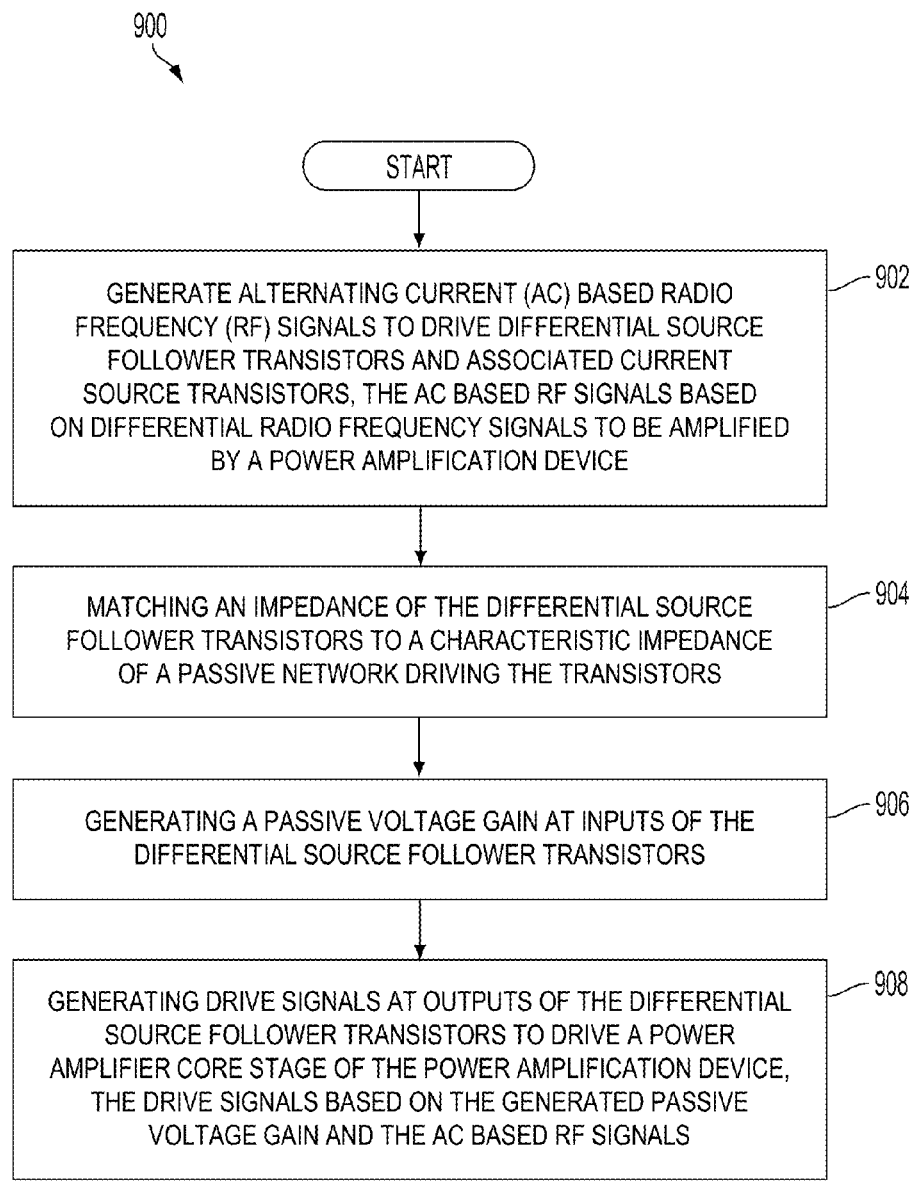
FIG. 9 is a process flow diagram illustrating a signal amplification method according to aspects of the present disclosure.

FIG. 9 is a process flow diagram 900 illustrating a method of performing signal amplification according to an aspect of the present disclosure. In block 902, a power amplifier driver stage of the power amplification device generates alternating current based radio frequency signals to drive differential source follower transistors and associated current source transistors. The alternating current based radio frequency signals are based on differential radio frequency signals to be amplified by the power amplification device. In block 904, the power amplifier driver stage matches an impedance of the differential source follower transistors to a characteristic impedance of a passive network driving the differential source follower transistors and the associated current source transistors. In block 906, the power amplifier driver stage generates a passive voltage gain at inputs of the differential source follower transistors. In block 908, the power amplifier driver stage generates drive signals at outputs of the differential source follower transistors to drive a power amplifier core stage of the power amplification device. The drive signals are based on the generated passive voltage gain and the alternating current based radio frequency signals.

According to a further aspect of the present disclosure, a power amplification device is described. The power amplification device includes means for transforming a voltage associated with the radio frequency signal. The voltage transforming means may include the input match and passive voltage gain circuit 418, the input match and passive voltage gain device 518 and/or the passive network 718. The power amplification device also includes means for generating a first bias signal to bias the power amplifier driver stage. The bias signal generating means may include the bias source 738 and/or the bias source 740. In another aspect, the aforementioned means may be any module or any apparatus configured to perform the functions recited by the aforementioned means.

Figure 10:
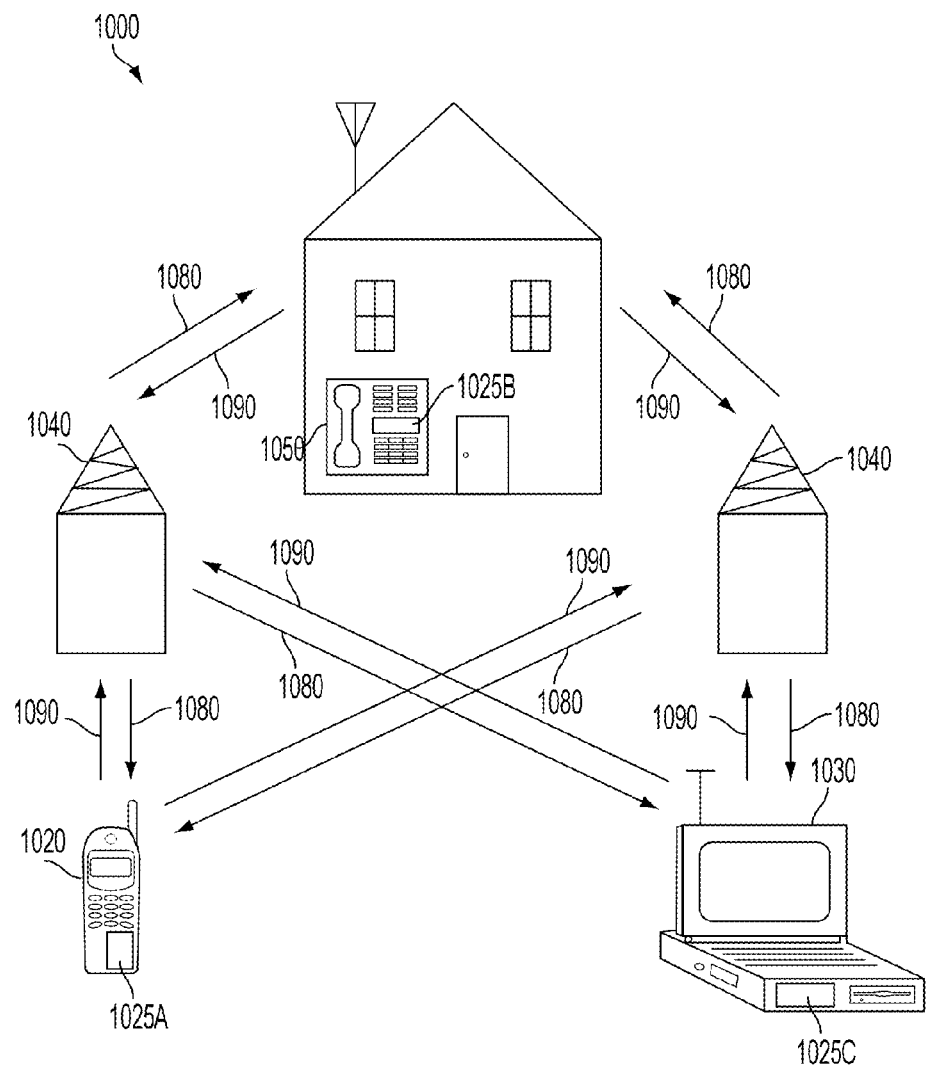
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed power amplification device. It will be recognized that other devices may also include the disclosed power amplification device, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed power amplification device.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A power amplification device, comprising:
   a power amplifier core stage;
   a power amplifier driver stage configured to receive a radio frequency signal to be amplified by the power amplification device, the power amplifier driver stage including a set of transistors including a first source follower input transistor and a first current source transistor, a source of the first source follower input transistor coupled to a drain of the first current source transistor, the source of the first source follower input transistor directly coupled to the power amplifier core stage to drive the power amplifier core stage;
   an input match and passive voltage gain device coupled to the power amplifier driver stage to generate a voltage gain at an input of the power amplifier driver stage; and
   a first bias source configured to generate a first bias signal to bias the power amplifier driver stage.

2. The power amplification device of claim 1, in which the voltage gain comprises a passive voltage gain based at least in part on a high input impedance of the first source follower input transistor relative to an impedance of an external source through which the radio frequency signal is provided to the power amplifier driver stage.

3. The power amplification device of claim 1, in which the set of transistors further comprises a second source follower input transistor and a second current source transistor, a source of the second source follower input transistor directly coupled to the power amplifier core stage to drive the power amplifier core stage, the set of transistors arranged in a differential configuration to generate differential signals to drive the power amplifier core stage.

4. The power amplification device of claim 3, in which the input match and passive voltage gain device comprises a transformer positioned between a first pairing of the first source follower input transistor and the first current source transistor and a second pairing of the second source follower input transistor and the second current source transistor.

5. The power amplification device of claim 4, in which the transformer comprises:
   a primary winding stage including a first pairing of a first capacitor and a primary winding inductor;
   a first secondary winding stage including a second pairing of a second capacitor and a first secondary winding inductor; and
   a second secondary winding stage including a third pairing of a third capacitor and a second secondary winding inductor.

6. The power amplification device of claim 5, in which a coupling factor between the primary winding stage and each of the first secondary winding stage and the second secondary winding stage is below forty percent and the coupling factor between the first secondary winding stage and the second secondary winding stage approaches unity.

7. The power amplification device of claim 5, in which the first capacitor, the second capacitor, and/or the third capacitor are independently adjustable to achieve impedance transformation, impedance matching, and/or power coupling over a range of frequencies.

8. The power amplification device of claim 5, further comprising a second bias source configured to generate a second bias signal, the first bias source coupled to the first secondary winding inductor and the second bias source coupled to the second secondary winding inductor.

9. The power amplification device of claim 5, in which the first secondary winding stage includes a first terminal of a first radio frequency signal polarity and a second terminal of a different second radio frequency signal polarity and the second secondary winding stage includes a third terminal of the first radio frequency signal polarity and a fourth terminal of the different second radio frequency signal polarity.

10. The power amplification device of claim 9, in which the first terminal is coupled to a gate of the second source follower input transistor and the second terminal is coupled to a gate of the first source follower input transistor to generate transistor radio frequency signals to the second source follower input transistor and the first source follower input transistor.

11. The power amplification device of claim 9, in which the third terminal is coupled to a gate of the first current source transistor and the fourth terminal is coupled to a gate of the second current source transistor to generate transistor radio frequency signals to the first current source transistor and the second current source transistor.

12. The power amplification device of claim 5, in which the primary winding stage is physically centrally positioned relative to the first secondary winding stage and the second secondary winding stage.

13. The power amplification device of claim 12, in which the first secondary winding stage and the second secondary winding stage are physically symmetrically equivalent.

14. The power amplification device of claim 1, in which the first source follower input transistor is configured to provide at least a portion of the radio frequency signal and bias signal to at least one transistor of the power amplifier core stage.

15. A power amplification device, comprising:
    a power amplifier core stage;
    a power amplifier driver stage configured to receive a radio frequency signal to be amplified by the power amplification device, the power amplifier driver stage including a set of transistors including a first source follower input transistor and a first current source transistor, a source of the first source follower input transistor coupled to a drain of the first current source transistor, the source of the first source follower input transistor directly coupled to the power amplifier core stage to drive the power amplifier core stage, in which the first source follower input transistor is configured to provide a bias signal and at least a portion of the radio frequency signal to at least one transistor of the power amplifier core stage;
    means for transforming a voltage associated with the radio frequency signal coupled to the power amplifier driver stage to generate a voltage gain at an input of the power amplifier driver stage; and
    means for generating a first bias signal to bias the power amplifier driver stage.

16. The power amplification device of claim 15, in which the voltage gain comprises a passive voltage gain based at least in part on a high input impedance of the first source follower input transistor relative to an impedance of an external source through which the radio frequency signal is provided to the power amplifier driver stage.

17. The power amplification device of claim 15, in which the set of transistors further comprises a second source follower input transistor and a second current source transistor, a source of the second source follower input transistor directly coupled to the power amplifier core stage to drive the power amplifier core stage, the set of transistors arranged in a differential configuration to generate differential signals to drive the power amplifier core stage.

18. The power amplification device of claim 1, in which the first source follower input transistor is configured to provide at least a portion of the radio frequency signal and bias signal to at least one transistor of the power amplifier core stage.

19. A method of performing signal amplification by a power amplification device, comprising:
generating alternating current based radio frequency signals to drive differential source follower transistors and associated current source transistors, the alternating current based radio frequency signals based at least in part on differential radio frequency signals to be amplified by the power amplification device;
matching an impedance of the differential source follower transistors to a characteristic impedance of a passive network driving the differential source follower transistors and the associated current source transistors;
generating a passive voltage gain at inputs of the differential source follower transistors; and
generating drive signals at outputs of the differential source follower transistors to drive a power amplifier core stage of the power amplification device, the drive signals based at least in part on the passive voltage gain and the alternating current based radio frequency signals.

20. The method of performing signal amplification of claim 19, further comprising receiving the differential radio frequency signals at the passive network.

21. The method of performing signal amplification of claim 19, further comprising receiving direct current based biased signals to bias the differential source follower transistors and the associated current source transistors at the passive network.

22. The method of performing signal amplification of claim 19, further comprising biasing the differential source follower transistors and associated current source transistors based at least in part on direct current based biased signals.

23. A power amplification device, comprising:
a power amplifier core stage;
a power amplifier driver stage configured to receive a radio frequency signal to be amplified by the power amplification device, the power amplifier driver stage including a set of transistors including a first source follower input transistor, a second source follower input transistor, a first current source transistor and a second current source transistor, a source of the first source follower input transistor coupled to a drain of the first current source transistor, the source of the first source follower input transistor and a source of the second source follower input transistor directly coupled to the power amplifier core stage to drive the power amplifier core stage, the set of transistors arranged in a differential configuration to generate differential signals to drive the power amplifier core stage;
an input match and passive voltage gain device coupled to the power amplifier driver stage to generate a voltage gain at an input of the power amplifier driver stage, the input match and passive voltage gain device comprising a transformer positioned between a first pairing of the first source follower input transistor and the first current source transistor and a second pairing of the second source follower input transistor and the second current source transistor; and
a first bias source configured to generate a first bias signal to bias the power amplifier driver stage.

* * * * *